United States Patent
Matsuzawa

(10) Patent No.: US 9,516,773 B2
(45) Date of Patent: Dec. 6, 2016

(54) LID BODY, PACKAGE, ELECTRONIC APPARATUS, MOVING OBJECT, AND METHOD FOR MANUFACTURING PACKAGE

(71) Applicant: Seiko Epson Corporation, Tokyo (JP)

(72) Inventor: Juichiro Matsuzawa, Minamiminowa (JP)

(73) Assignee: Seiko Epson Corporation (JP)

( * ) Notice: Subject to any disclaimer, the term of this patent is extended or adjusted under 35 U.S.C. 154(b) by 0 days.

(21) Appl. No.: 14/537,132

(22) Filed: Nov. 10, 2014

(65) Prior Publication Data

US 2015/0130548 A1    May 14, 2015

(30) Foreign Application Priority Data

Nov. 11, 2013   (JP) .................. 2013-232791

(51) Int. Cl.
| | | |
|---|---|---|
| *H01L 41/053* | (2006.01) | |
| *H03B 5/30* | (2006.01) | |
| *H03H 9/10* | (2006.01) | |
| *H05K 5/06* | (2006.01) | |
| *H05K 5/02* | (2006.01) | |
| *H01L 23/04* | (2006.01) | |
| *H01L 21/50* | (2006.01) | |
| *H01L 23/544* | (2006.01) | |

(52) U.S. Cl.
CPC ............. *H05K 5/0239* (2013.01); *H01L 21/50* (2013.01); *H01L 23/04* (2013.01); *H01L 23/544* (2013.01); *H01L 41/053* (2013.01); *H03B 5/30* (2013.01); *H03H 9/10* (2013.01); *H05K 5/069* (2013.01); *H01L 2223/5442* (2013.01); *H01L 2223/54426* (2013.01); *H01L 2223/54486* (2013.01); *H01L 2224/16225* (2013.01)

(58) Field of Classification Search
CPC ........... H01L 41/053; H03B 5/30; H03B 5/32; H03H 9/10; H05K 5/0239; H05K 5/06; H05K 5/069
USPC .... 310/344, 348; 331/68, 69, 154, 156, 158; 361/679.01, 807, 809
See application file for complete search history.

(56) References Cited

U.S. PATENT DOCUMENTS

| | | | | |
|---|---|---|---|---|
| 7,474,039 B2* | 1/2009 | Horie | ................... | H03H 9/0542 310/340 |
| 7,891,994 B2* | 2/2011 | Shi | ................... | H05K 5/0239 439/131 |
| 8,053,954 B2* | 11/2011 | Yang | ................... | H04R 17/00 310/328 |

(Continued)

FOREIGN PATENT DOCUMENTS

| | | |
|---|---|---|
| JP | 05-11535 U | 2/1993 |
| JP | 2001-274649 A | 10/2001 |

(Continued)

*Primary Examiner* — Levi Gannon
(74) *Attorney, Agent, or Firm* — Harness, Dickey & Pierce, P.L.C.

(57) ABSTRACT

A lid body includes: a first surface; a second surface having a top-bottom relation with the first surface; an outer peripheral surface connecting the first surface and the second surface; a groove provided in the first surface from the outer peripheral surface toward an interior of the first surface; and first and second marks arranged at positions that do not overlap with an outer peripheral edge of the second surface in a plan view.

20 Claims, 12 Drawing Sheets

(56) References Cited

U.S. PATENT DOCUMENTS

| | | | |
|---|---|---|---|
| 8,231,994 B2* | 7/2012 | Zhou | H04M 1/0262 361/679.01 |
| 8,362,676 B2 | 1/2013 | Morita | |
| 9,018,826 B2* | 4/2015 | Sasaki | H03H 9/0595 310/344 |
| 2010/0238616 A1* | 9/2010 | Yokote | G06F 1/1637 361/679.01 |
| 2011/0157783 A1* | 6/2011 | Huang | H04M 1/0262 361/679.01 |
| 2011/0170242 A1* | 7/2011 | Yuan | G06F 1/1626 361/679.01 |
| 2013/0002096 A1* | 1/2013 | Umeki | H03H 3/04 310/344 |
| 2013/0088813 A1* | 4/2013 | Su | G06F 1/1628 361/679.01 |
| 2015/0049452 A1* | 2/2015 | Franck | E04F 19/00 361/809 |

FOREIGN PATENT DOCUMENTS

| | | |
|---|---|---|
| JP | 2004-320150 A | 11/2004 |
| JP | 2005-353885 A | 12/2005 |
| JP | 2006-073679 A | 3/2006 |
| JP | 2008-153485 A | 7/2008 |
| JP | 2009-099806 A | 5/2009 |
| JP | 2010-262252 A | 11/2010 |
| JP | 2012-034086 A | 2/2012 |

* cited by examiner

LID BODY, PACKAGE, ELECTRONIC APPARATUS, MOVING OBJECT, AND METHOD FOR MANUFACTURING PACKAGE

BACKGROUND

1. Technical Field

The present invention relates to a lid body, a package, an electronic apparatus, a moving object, and a method for manufacturing a package.

2. Related Art

Recently, as the use of portable electronic apparatuses is becoming widespread, a reduction in the size, weight and cost of such electronic apparatuses is increasingly demanded. Therefore, a reduction in size and cost while maintaining high accuracy is increasingly demanded with respect to electronic components used in the electronic apparatuses as well. Particularly, in an oscillation device having an oscillation element housed within a package, the oscillation characteristic is maintained by keeping the space housing the oscillation element in an airtight condition. Therefore, various sealing techniques for this are proposed.

For example, in the joining method disclosed in JP-A-2008-153485, a lid body (lid) of a container that covers an opening of a space housing an oscillation device element (oscillation element) and an opening peripheral edge of the container are joined (sealed) together, thus forming a package. In this joining, seam welding is performed, leaving a part of the outer periphery of the lid body (an unwelded part) as an unsealed area. Then, after the internal space of the package is degassed, the unwelded part (the above unsealed area) is irradiated with a heating beam, thus sealing the lid body and the opening peripheral edge together.

However, in the joining method disclosed in JP-A-2008-153485, the position of the lid body in relation to the container may vary when the seal welding of the container and the lid body is performed. If the positional relation between the container and the unsealed area vary in this manner and the preset position of the unsealed area is irradiated with a heating beam or the like, the unsealed area and the irradiating position of the heating beam may not meet each other and the unsealed area may not be irradiated with the heating beam. Consequently, there is a risk that the sealing in the unsealed area may be insufficient, causing a sealing failure (an air leak failure).

SUMMARY

An advantage of some aspects of the invention is to solve at least a part of the problems described above, and the invention can be implemented in the following forms or application examples.

Application Example 1

This application example is directed to a lid body including: a first surface; a second surface having a top-bottom relation with the first surface; an outer peripheral surface connecting the first surface and the second surface; a groove portion provided on the first surface from the outer peripheral surface toward more inside than an area of the first surface that contacts the outer peripheral surface; and a mark arranged at a position that does not overlap with an outer peripheral edge of the second surface, as viewed in a plan view.

According to this application example, since the mark corresponding to the groove portion is provided on the second surface of the lid body, the position of the groove portion on the first surface (back side) can be calculated on the basis of the mark. Thus, as the position of the groove portion is specified, a misalignment at the time of sealing the groove portion can be prevented and the occurrence of a sealing failure (an air leak failure) can be reduced. Also, since the mark is provided on the second surface and arranged at the position that does not overlap with the outer peripheral edge of the second surface, as viewed in a plan view, the mark will not be deformed even if the vicinity of the outer peripheral edge of the second surface is deformed by joining or the like, and the posture of the lid body can be constantly recognized with the mark.

Application Example 2

In the lid body according to the application example described above, it is preferable that the mark is provided at a position that overlaps with the groove portion.

According to this application example, since the end of the groove portion can be recognized directly with the mark, the detection accuracy of the position of the groove portion is enhanced and the likelihood of a sealing failure of the groove portion can be reduced.

Application Example 3

In the lid body according to the application example described above, it is preferable that the mark has a plurality of recognition areas.

According to this application example, since the mark has the plurality of recognition areas where the recognition of the position can be carried out, a rotational misalignment of the lid body can be calculated and the detection accuracy of the position of the groove portion can be enhanced further. Therefore, the likelihood of a sealing failure of the groove portion can be reduced.

Application Example 4

In the lid body according to the application example described above, it is preferable that the mark is provided in a plural number.

According to this application example, since a plurality of marks is provided, a misalignment or the like in the rotating direction of the lid can be recognized further and the amount of misalignment can be calculated. Therefore, sealing accuracy is enhanced further.

Application Example 5

In the lid body according to the application example described above, it is preferable that the marks are arranged in different areas on the second surface divided by a first imaginary straight line that bisects the lid body, connecting the center of a width of the groove portion in a direction intersecting with an extending direction of an imaginary line connecting the groove portion and a center part of the first surface, and the center of the first surface.

According to this application example, since the marks are arranged in the areas on both sides of the groove portion, a long spacing can be provided between the marks and the detection accuracy of the position of the groove portion is enhanced. Therefore, the likelihood of a sealing failure of the groove portion can be reduced.

Application Example 6

In the lid body according to the application example described above, it is preferable that the marks are arranged at line-symmetrical positions about the first imaginary straight line.

According to this application example, since the marks are arranged in the areas on both sides of the groove portion and the marks are arranged at an equal distance from the position of the groove portion, position recognition processing can be carried out easily.

Application Example 7

In the lid body according to the application example described above, it is preferable that a straight line passing through the center of each of the marks that are line-symmetrical about the first imaginary straight line is defined as a second imaginary straight line, and that a distance between the second imaginary straight line and a point of intersection between the first imaginary straight line and the outer peripheral surface on the side where the groove portion is provided, as viewed in a plan view, is shorter than a distance between the center of the mark and the first imaginary straight line.

According to this application example, the spacing between the centers of the marks with which a misalignment in the rotating direction is determined and the first imaginary straight line is longer than the distance between the second imaginary straight line passing through the center of each of the marks and the point of intersection between the first imaginary straight line and the outer peripheral surface on the side where the groove portion is provided, as viewed in a plan view. Therefore, the detection accuracy in the rotating direction can be maintained even if there are some positional recognition errors of the marks, and the detection accuracy of the position of the groove portion is enhanced. Thus, the likelihood of a sealing failure of the groove portion can be reduced.

Application Example 8

In the lid body according to the application example described above, it is preferable that the mark is provided also on the first imaginary straight line.

According to this application example, since the mark is provided in at least three areas, a misalignment in the rotating direction of the lid body can be recognized with higher accuracy and the detection accuracy of the position of the groove portion is enhanced. Therefore, the likelihood of a sealing failure of the groove portion can be reduced.

Application Example 9, 10 and 11

In the lid body according to the application example described above, it is preferable that a joining area joined to a container is provided on the first surface, and that the mark is provided at a position that does not overlap with the joining area, as viewed in a plan view.

According to these application examples, since the mark and the joining area do not meet each other, for example, even if the joining area is melted by welding or the like, the mark will not melt away and the detection accuracy of the position of the groove portion is enhanced. Therefore, the likelihood of a sealing failure of the groove portion can be reduced.

Application Examples 12 and 13

These application examples are directed to a package including: the lid body according to any one of the application examples described above; and a container having a joining area joined to the lid body. The joining area of the container and the first surface of the lid body are joined together.

According to these application examples, the package has the lid body according to one of the above application examples. Thus, a package with enhanced detection accuracy of the position of the groove portion and with reduced sealing failure of the groove portion can be provided.

Application Examples 14 and 15

In the package according to the application example described above, it is preferable that the joining area is joined, using a welding method, and that the mark is provided at a position that does not overlap with the joining area.

According to these application examples, since the package has the lid body according to one of the above application examples, even if the joining area is melted by welding, the mark will not melt away. Thus, a package with enhanced detection accuracy of the position of the groove portion and with reduced sealing failure of the groove portion can be provided.

Application Examples 16 and 17

These application examples are directed to an electronic apparatus including the package according to the above application example.

According to these application examples, by using the package with reduced sealing failure of the groove portion, it is possible to provide an electronic apparatus with improved reliability.

Application Example 18

This application example is directed to a moving object including the package according to the application example described above.

According to this application example, by using the package with reduced sealing failure of the groove portion, it is possible to provide a moving object with improved reliability.

Application Example 19

This application example is directed to a method for manufacturing a package including: preparing a lid body including a first surface, a second surface having a top-bottom relation with the first surface, an outer peripheral surface connecting the first surface and the second surface, a groove portion provided on the first surface from the outer peripheral surface toward more inside than an area of the first surface that contacts the outer peripheral surface, and a mark arranged at a position that does not overlap with an outer peripheral edge of the second surface, as viewed in a plan view, and a container having a joining area; arranging the lid body and the container in such a way that the first surface of the lid body and the joining area of the container face each other; joining the lid body and the container together in an area excluding the groove portion; determining a position of the groove portion, using the mark; and closing an area between the groove portion and the joining area on the basis of the determination.

According to this application example, the lid body having the mark provided on the second surface is used, and the position of the groove portion on the first surface (back side) can be calculated on the basis of the mark. Thus, as the position of the groove portion is specified, a misalignment at the time of sealing the groove portion can be prevented and the occurrence of a sealing failure (an air leak failure) can be reduced. Also, since the mark will not melt away even if the joining area is melted by welding, the position of the groove portion can be detected securely and appropriately.

BRIEF DESCRIPTION OF THE DRAWINGS

Embodiments of the invention will be described with reference to the accompanying drawings, wherein like numbers reference like elements.

FIG. 2A is a plan view. FIG. 2B are front cross-sectional view.

FIG. 4A is a plan view. FIG. 4B is a front cross-sectional view.

FIGS. 6A and 6C are plan views. FIGS. 6B and 6D are front cross-sectional views.

DESCRIPTION OF EXEMPLARY EMBODIMENTS

Electronic Device

Hereinafter, a lid body, an electronic device having a package in which the lid body is used, a method for manufacturing the electronic device, and an electronic apparatus and moving object having the package will be described in detail with reference to the accompanying drawings.

First Embodiment

First, as a first embodiment of the invention, a package having a lid body, an oscillator as an electronic device using the package, and a method for manufacturing the oscillator will be described with reference to FIG. 1 to FIGS. 6A to 6D.

Figure 1:
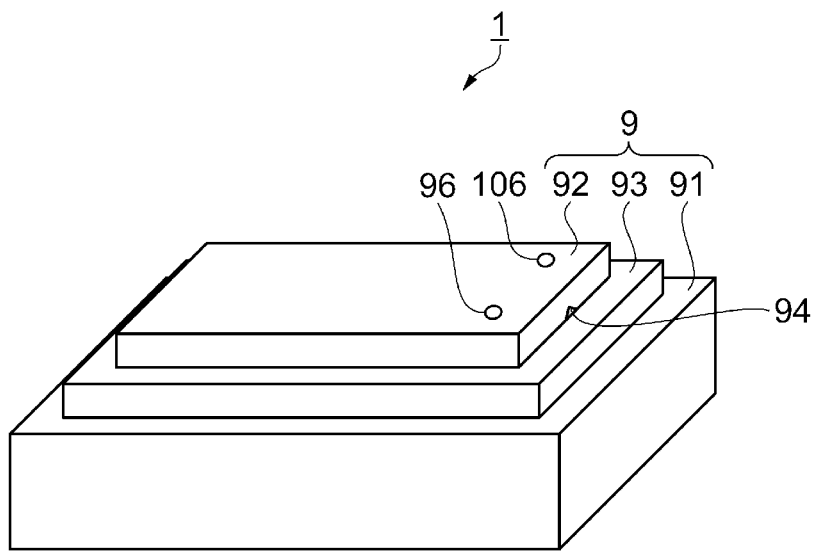
FIG. 1 is a perspective view schematically showing an oscillator according to a first embodiment.
Figure 2A:
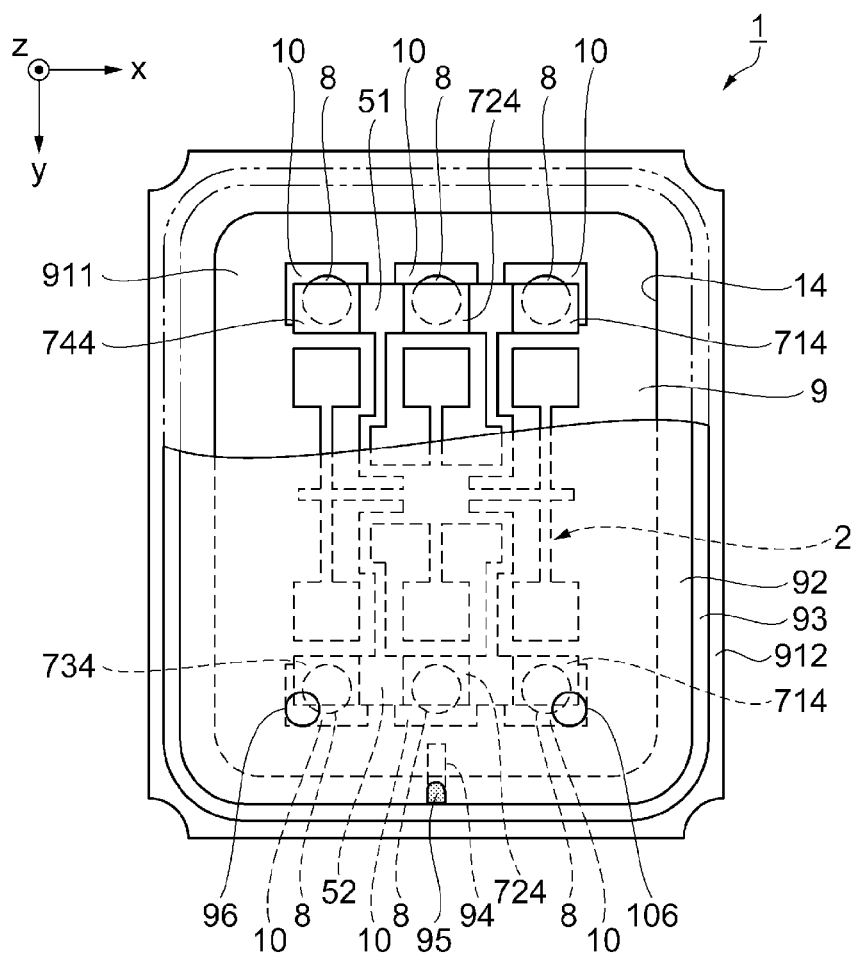
FIGS. 2A and 2B are schematic views showing the oscillator according to the first embodiment.
Figure 2B:
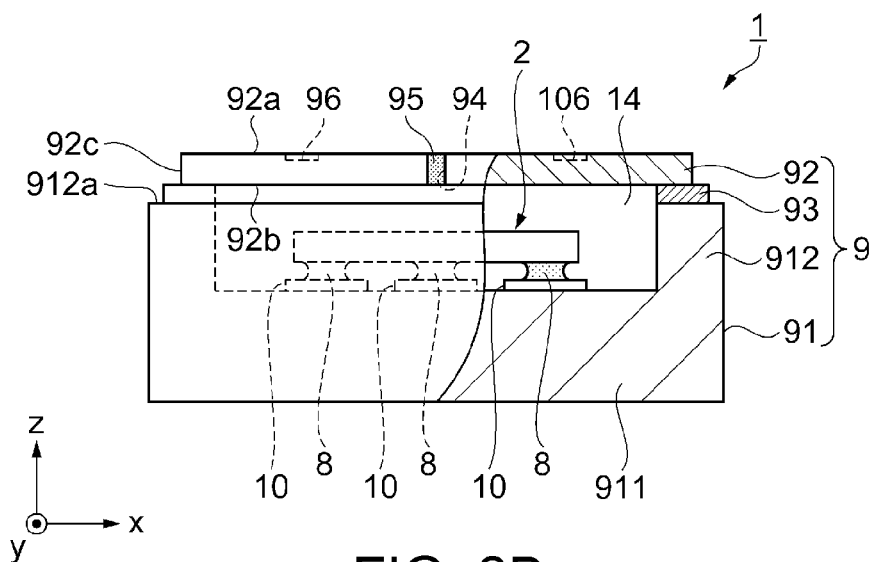
Figure 3:
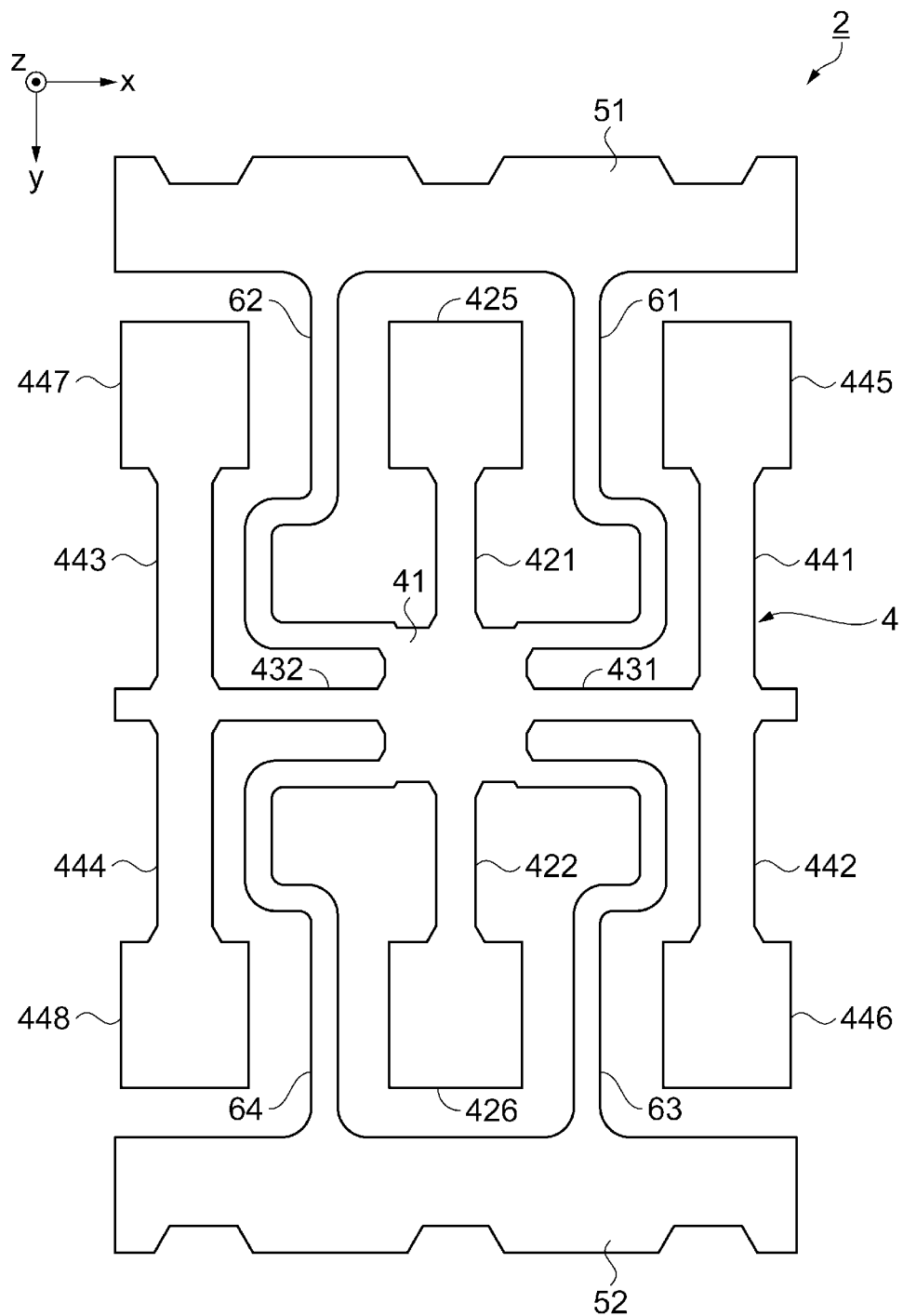
FIG. 3 is a plan view showing a gyro element as an electronic component used for the oscillator.
Figure 4A:
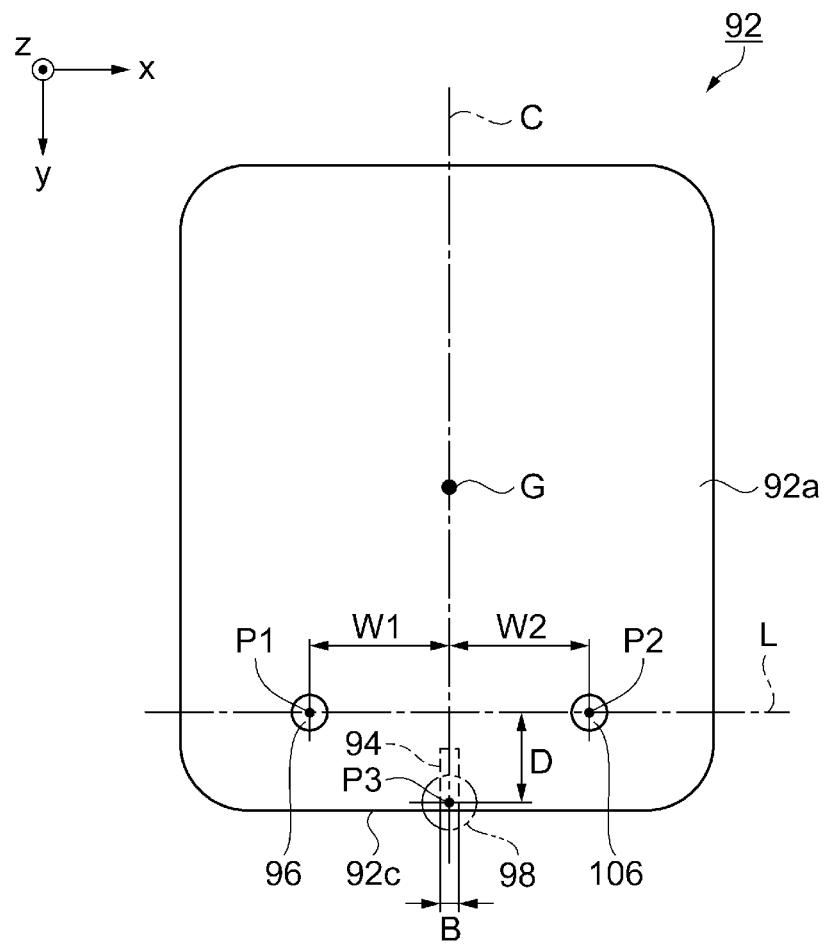
FIGS. 4A and 4B show an example of a lid body (lid) used for the oscillator.
Figure 4B:
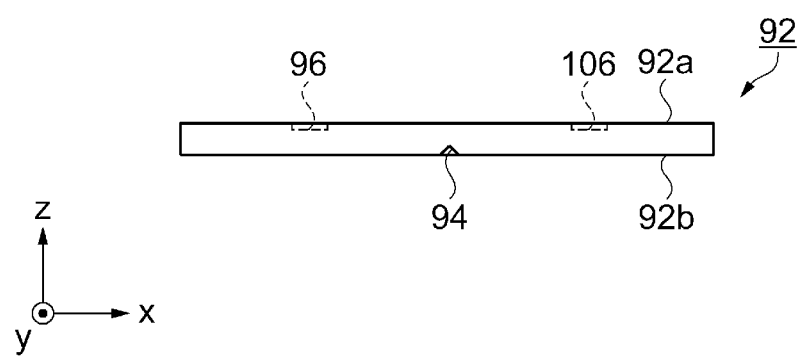
Figure 5A:
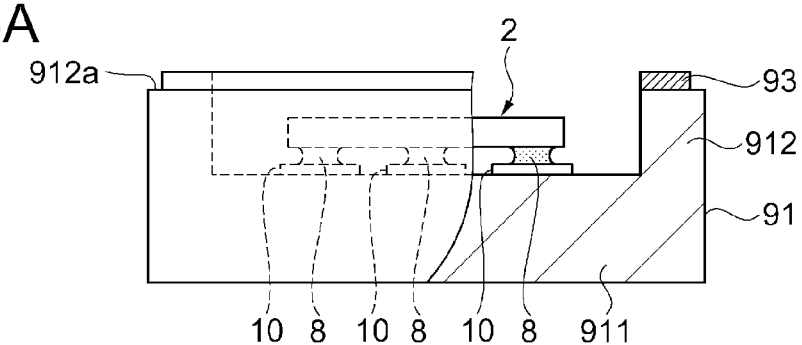
FIGS. 5A to 5D are front cross-sectional views schematically showing the manufacturing process of the oscillator.
Figure 5B:
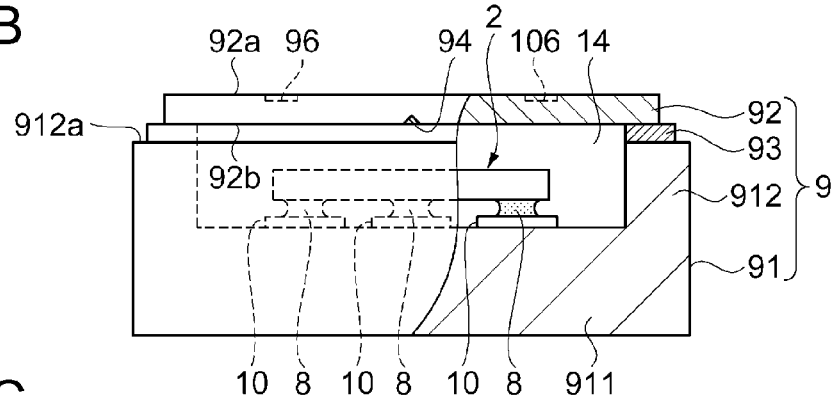
Figure 5C:
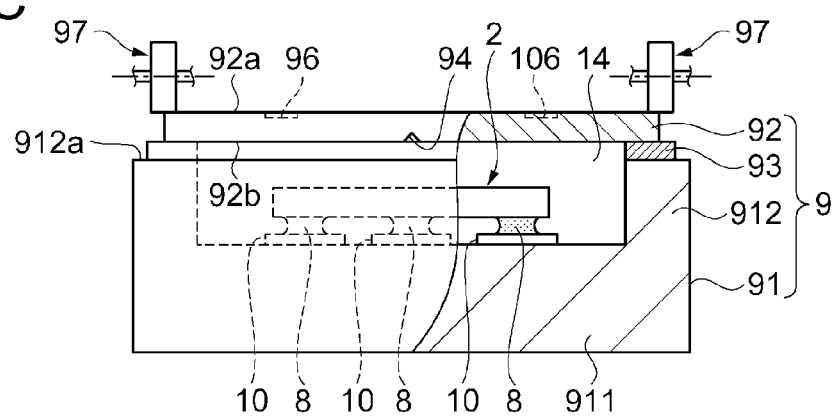
Figure 5D:
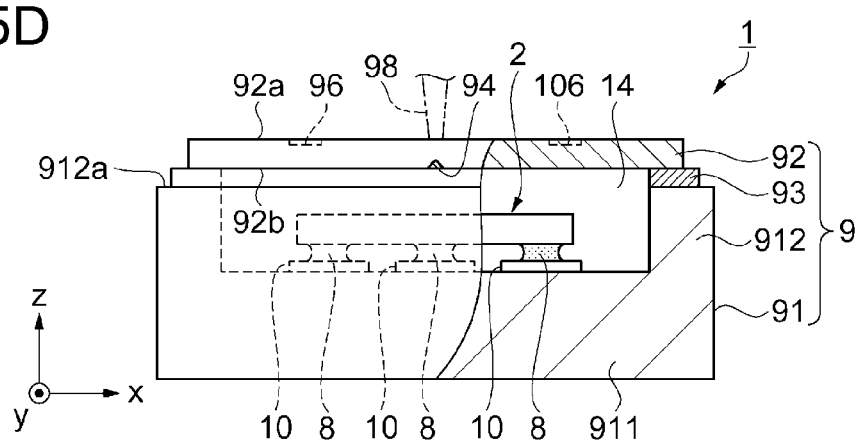
Figure 6A:
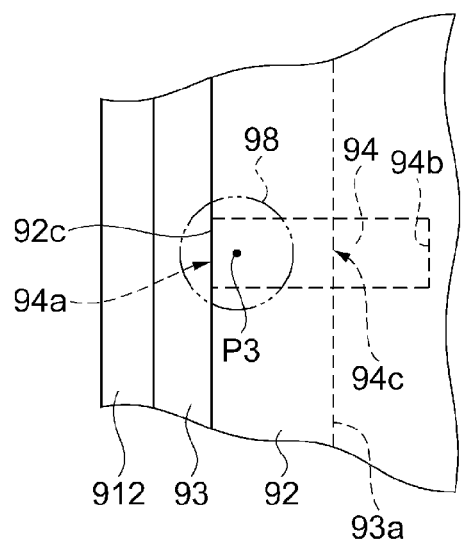
FIGS. 6A to 6D show the joining state between a lid and a base in the sealing process.
Figure 6C:
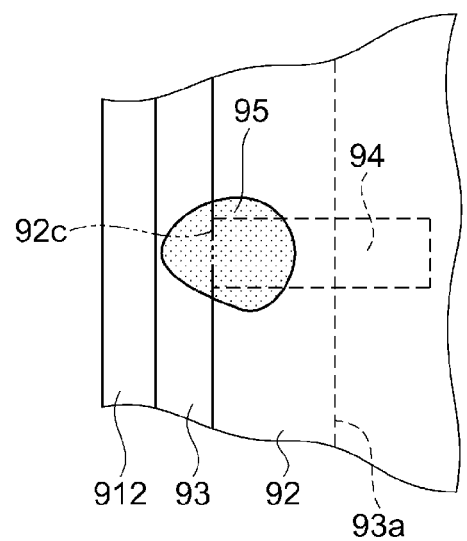
Figure 6B:
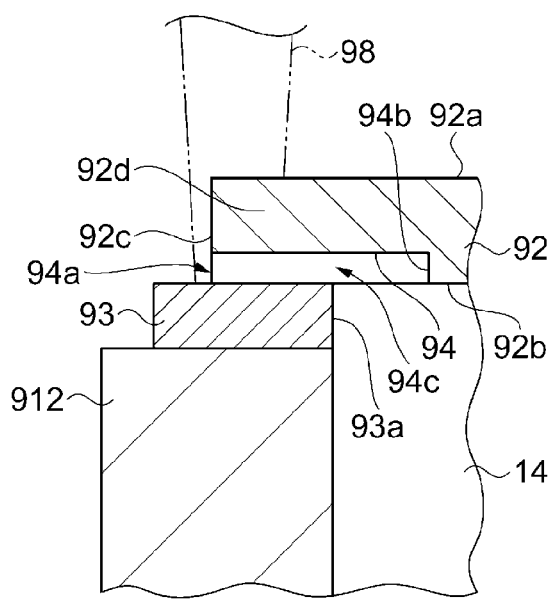
Figure 6D:
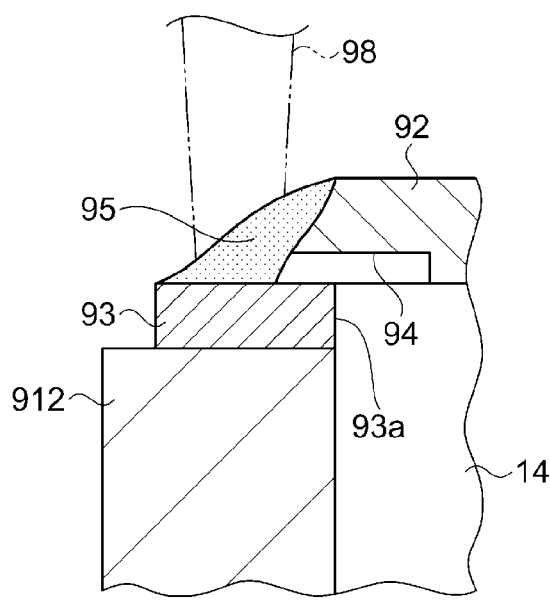

FIG. 1 is a schematic perspective view showing an oscillator as an electronic device using a lid body according to the invention. FIGS. 2A and 2B schematically show the oscillator according to the first embodiment. FIG. 2A is a plan view. FIG. 2B is a front cross-sectional view. FIG. 3 is a plan view showing a gyro element as an electronic component of the oscillator shown in FIGS. 2A and 2B. FIGS. 4A and 4B show an example of a lid body (lid) used for the oscillator. FIG. 4A is a plan view. FIG. 4B is a front cross-sectional view. FIGS. 5A to 5D are front cross-sectional views schematically showing the manufacturing process of the oscillator. FIGS. 6A and 6D show the joining state between a lid and a base. FIGS. 6A and 6C are plan views. FIGS. 6B and 6D are front cross-sectional views. Hereinafter, as shown in FIGS. 2A and 2B, three axes that are orthogonal to each other are referred to as x-axis, y-axis and z-axis. The z-axis coincides with the direction of the thickness of the oscillator. A direction parallel to the x-axis is referred to as "x-axis direction". A direction parallel to the y-axis direction is referred to as "y-axis direction". A direction parallel to the z-axis is referred to as "z-axis direction".

An oscillator 1 shown in FIG. 1 and FIGS. 2A and 2B has a gyro element (oscillation element) 2 as an electronic component, and a package 9 which houses the gyro element 2 in an internal space 14. Hereinafter, the gyro element 2 and the package 9 will be described in order and in detail. The package 9 shown in FIG. 1 includes a base 91, a seam ring 93 as a joining member (an annular sealing body), and a lid 92 as a lid body. On the lid 92, a groove 94 as a groove portion, and a first mark 96 and a second mark 106 as two marks are provided. FIG. 1, showing the groove 94 provided on the lid 92, shows the state where sealing (sealing process), described later, is not carried out. Also, the first mark 96 and the second mark 106 are provided on the side opposite to the groove 94 and function as marks for position recognition of the groove 94.

Gyro Element

FIG. 3 is a plan view showing the gyro element viewed from above (the z-axis direction in FIGS. 2A and 2B on the side of the lid 92, later described). The gyro element is provided with a detection signal electrode, a detection signal wire, a detection signal terminal, a detection grounding electrode, a detection grounding wire, a detection grounding terminal, a drive signal electrode, a drive signal wire, a drive signal terminal, a drive grounding electrode, a drive grounding wire, and a drive grounding terminal or the like, though not shown in FIG. 3.

The gyro element 2 is an "out-of-plane detection type" sensor which detects angular velocity about the z-axis. Although not shown, the gyro element 2 includes a base member and a plurality of electrodes, wires and terminals provided on the surface of the base member. The gyro element 2 can be formed with a piezoelectric material such as quartz crystal, lithium tantalate or lithium niobate. Of these, quartz crystal is preferable. This provides a gyro element 2 capable of exhibiting an excellent oscillation characteristic (frequency characteristic).

Such a gyro element 2 has an oscillator 4 having a so-called double-T shape, a first support portion 51 and a second support portion 52 as support portions supporting the oscillator 4, and a first beam 61, a second beam 62, a third beam 63 and a fourth beam 64 as beams connecting the oscillator 4 and the first and second support portions 51, 52.

The oscillator 4 expands on the xy-plane and has a thickness in the z-axis direction. Such an oscillator 4 has a base portion 41 situated at the center, a first detection oscillation arm 421 and a second detection oscillation arm 422 extending to both sides from the base portion 41 along the y-axis direction, a first connection arm 431 and a second connection arm 432 extending to both sides from the base portion 41 along the x-axis direction, a first drive oscillation arm 441 and a second drive oscillation arm 442 as oscillation arms extending to both sides from a distal end portion of the first connection arm 431 along the y-axis direction, and a third drive oscillation arm 443 and a fourth drive oscillation arm 444 as oscillation arms extending to both sides from a distal end portion of the second connection arm 432 along the y-axis direction. At distal end portions of the first and second detection oscillation arms 421, 422 and the first, second, third and fourth drive oscillation arms 441, 442, 443, 444, weight portions (hammerheads) 425, 426, 445, 446, 447, 448 are provided, respectively, as substantially quadrilateral broad portions with a greater width than the proximal end side. The provision of such weight portions 425, 426, 445, 446, 447, 448 improved the detection sensitivity of the gyro sensor 2 to angular velocity.

Each of the first and second support portions 51, 52 extends along the x-axis direction. The oscillator 4 is situated between these first and second support portions 51, 52. In other words, the first and second support portions 51, 52 are arranged to face each other along the y-axis direction via the oscillator 4. The first support portion 51 is connected to the base portion 41 via the first beam 61 and the second beam 62. The second support portion 52 is connected to the base portion 41 via the third beam 63 and the fourth beam 64.

The first beam 61 passes between the first detection oscillation arm 421 and the first drive oscillation arm 441 and connects the first support portion 51 and the base portion 41. The second beam 62 passes between the first detection oscillation arm 421 and the third drive oscillation arm 443 and connects the first support portion 51 and the base portion 41. The third beam 63 passes between the second detection oscillation arm 422 and the second drive oscillation arm 442 and connects the second support portion 52 and the base portion 41. The fourth beam 64 passes between the second detection oscillation arm 422 and the fourth drive oscillation arm 444 and connects the second support portion 52 and the base portion 41.

Each of the beams 61, 62, 63, 64 is formed in an elongated shape having a meandering portion extending along the y-axis direction while moving back and forth along the x-axis direction and thus has elasticity in all directions. Therefore, even if an external impact is applied, each of the beams 61, 62, 63, 64 has an impact absorbing effect and therefore a detection noise due to the impact can be reduced or restrained.

The gyro element 2 of such a configuration detects angular velocity ω about the z-axis as follows. In the gyro element 2, in the state where no angular velocity ω is applied, when an electric field is generated between the drive signal electrode (not shown) and the drive grounding electrode (not shown), the respective drive oscillation arms 441, 442, 443, 444 bend and oscillate in the x-axis direction. In this case, the first and second drive oscillation arms 441, 442 and the third and fourth drive oscillation arms 443, 444 oscillate with plane symmetry about the yz-plane passing through the center point (center of gravity). Therefore, the base portion 41, the first and second connection arms 431, 432, and the first and second detection oscillation arms 421, 422 hardly oscillate.

If angular velocity ω about the z-axis is applied to the gyro element 2 in the state where this drive oscillation is performed, a Coriolis force in the y-axis direction acts on the respective drive oscillation arms 441, 442, 443, 444 and the connection arms 431, 432. In response to this oscillation in the y-axis direction, detection oscillation in the x-axis direction is excited. The strain in the detection oscillation arms 421, 422 generated by this oscillation is detected by the detection signal electrode (not shown) and the detection grounding electrode (not shown), thus finding the angular velocity ω.

Package

Back to FIG. 1 and FIGS. 2A and 2B, the package 9 will be described. The package 9 is configured to house the gyro element 2. In the package 9, a circuit element (IC chip) or the like for the driving or the like of the gyro element 2 may be housed as well as the gyro element 2. Such a package 9 is substantially rectangular, as viewed in a plan view (as viewed on the xy-plane).

The package 9 has the base 91 having a recessed portion opening upward, and the lid 92 as a lid body joined to the base via the seam ring 93 as a joining member, so as to close the opening of the recessed portion. The base 91 has a plate-like bottom plate 911 and a frame-like sidewall 912 provided on an upper peripheral edge portion of the bottom plate 911. The frame-like sidewall 912 is provided as a substantially rectangular perimeter. In other words, the shape of the opening that opens to the top side of the recessed portion is substantially rectangular. The recessed portion surrounded by the plate-like bottom plate 911 and the frame-like sidewall 912 is the internal space (housing space) 14 to house the gyro element 2. The seam ring 93 made of an alloy, for example, kovar or the like, is provided on an upper surface 912a of the frame-like sidewall 912. The seam ring 93 has the function as a joining member between the lid 92 and the sidewall 912 and is provided in the shape of frame (substantially rectangular perimeter) along the upper surface 912a of the sidewall 912.

The lid 92 has a substantially rectangular outer shape and has a first surface 92b, a second surface 92a in a top-bottom relation with the first surface 92b (i.e., opposite the first surface 92b), and an outer peripheral surface 92c connecting the first surface 92b and the second surface 92a. In the lid 92, the closed-bottom groove 94 as a groove portion (a channel) is provided from the outer peripheral surface 92c toward the center part on the first surface 92b, which is the surface on the side of the seam ring 93 provided on the upper surface of the sidewall 912. The groove 94 extends to a position overlapping with the internal space 14, as viewed in a plan view, from the edge on the side of the outer peripheral surface 92c of the lid 92 when the lid 92 is placed on the seam ring 93. The lid 92 also has the first mark 96 and the second mark 106 as marks provided on the second surface 92a and at positions that do not overlap with the outer peripheral edge of the second surface 92a. Here, "as viewed in a plan view" refers to the case where the lid 92 is viewed from the side of the second surface 92a of the lid 92. Details of the configuration of the lid 92 will be described later.

The package 9 as described above has the internal space 14 inside, and the gyro element 2 is housed and installed airtightly in the internal space 14. The internal space 14, where the gyro element 2 is housed, is exhausted of gas (degassed) and subsequently sealed airtightly as a communicating portion that is a gap between the first surface 92b on the side opposite to the second surface 92a of the lid 92, where the groove 94 is provided, and the seam ring 93 is closed by a sealing portion 95 melted by an energy beam (for example, a laser beam) and then solidified. The sealing portion 95 is formed as an end portion on the outer side of the groove 94, that is, a portion including the outer peripheral surface 92c of the lid 92, is melted and solidified. The energy beam is also referred to as heating beam.

The material forming the base 91 is not particularly limited. However, various ceramics such as aluminum oxide can be used. The material forming the lid 92 is not particularly limited. However, a member with a coefficient of linear expansion that is approximate to that of the material forming the base 91 may be employed. For example, an alloy such as kovar is preferable if the above ceramic is used as the material forming the base 91.

The gyro element 2 is fixed at the first and second support portions 51, 52 to the upper surface of the bottom plate 911 via a conductive fixing member 8 such as a solder or conductive adhesive (adhesive containing a conductive filler of metal particles such as silver dispersed in a resin material). Since the first and second support portions 51, 52 are situated at both ends in the y-axis direction of the gyro element 2, fixing these portions to the bottom plate 911 enables the oscillator 4 of the gyro element 2 to be double-supported and thus enables the gyro element 2 to be fixed stably to the bottom plate 911. Therefore, unwanted oscillation of the gyro element 2 (oscillation other than detection oscillation) is restrained and the detection accuracy of the angular velocity ω by the gyro element 2 is improved.

Six conductive fixing members 8 are provided, spaced apart from each other and corresponding to (contacting) two detection signal terminals 714, two detection grounding terminals 724, a drive signal terminal 734 and a drive grounding terminal 744 provided on the first and second support portions 51, 52. On the upper surface of the bottom plate 911, six connection pads 10 corresponding to the two detection signal terminals 714, the two detection grounding terminals 724, the drive signal terminal 734 and the drive grounding terminal 744 are provided. The respective connection pads 10 and the corresponding ones of the terminals are electrically connected together via the conductive fixing members 8.

Lid as Lid Body

Now, the lid 92 as a lid body will be described in detail, referring to FIGS. 4A and 4B and FIGS. 6A to 6D. The lid 92 as a lid body closes the opening of the recessed portion that opens to the top side of the package 9, and the periphery of the opening of the recessed portion is joined to the seam ring 93, for example, by using a seam welding method. To explain in more detail, the lid 92 is a plate-like member having the second surface 92a and the first surface 92b that are in a top-bottom relation and the outer peripheral surface 92c that connects the second surface 92a and the first surface 92b. Since the lid 92 in this example has the shape of a plate, the lid 92 can be easily formed and has excellent shape stability. Particularly, the groove 94, the first mark 96 and the second mark 106, described later, are extremely small groove and recesses. However, the groove and the marks can be formed easily. A kovar plate member is used for the lid 92. As a kovar plate is used for the lid 92, the seam ring 93 and the lid 92, which are made of kovar, are melted in the same melting state at the time of sealing. Moreover, since it is easy to form an alloy thereof, the sealing can be carried out easily and securely. Also, plates of other materials than kovar can be used for the lid 92. For example, a metal material such as 42 alloy or stainless steel, or the same material as the sidewall 912 of the package 9 can also be used.

When the lid 92 is viewed in a plan view from the side of the second surface 92a, the closed-bottom groove 94 extending from one side of the outer peripheral surface 92c toward the center part of the lid 92 (an example of more inside than the area that contacts the outer peripheral surface 92a) is provided on the first surface 92b. The groove 94 is provided with a wedged opening shape (for example, substantially a triangle having two vertices on the side of the first surface 92b), as viewed from the side of the outer peripheral surface 92c, and is situated substantially at the center of one side, as viewed in a plan view. The groove 94 is on the first surface 92b, which is the placement surface to the package 9 when the lid 92 is placed to close the opening of the recessed portion opening to the top side of the package 9, and is provided toward the center part from the outer peripheral surface 92c of the lid 92, at a position overlapping with at least the top side of the package 9, as viewed in the plan view. In this example, the groove 94 is arranged toward the center part from the outer peripheral surface 92c of the lid 92, so as to have a portion that overlaps with the opening of the recessed portion opening to the top side of the package 9, as viewed in a plan view. In other words, as shown in FIGS. 6A and 6B, the groove 94 has one end 94a opening to the outer peripheral surface 92c and the other end 94b on the center side, and the other end 94b on the center side is provided to reach further inside than an inner wall surface 93a of the seam ring 93 (internal space on the center side of the package, as viewed in a plan view). That is, the other end 94b of the groove 94 is provided at a position overlapping with a part that is further inside than the inner wall surface 93a of the seam ring 93, as viewed in a plan view (internal space on the center side of the package, as viewed in the plan view). As the groove 94 is thus provided, a gap that enables gas exhaustion 94c from the internal space 14 of the package 9 as described above can be provided securely.

The provision of the groove 94 on a short side of the lid 92, as viewed in a plan view, can achieve the following effect. The package 9 tends to be deformed in the direction of the thickness (z-axis direction), more in the direction of the long side than in the direction of the short side. Therefore, in the lid 92 joined to the package 9, greater residual stress is present in the direction of the long side than in the direction of the short side. If the portion where the groove 94 is formed is melted for sealing (described later) while the large residual stress remains, the residual stress is applied to the sealed part, risking damage to the reliability of the sealing. Therefore, by providing the groove 94 on the short side where residual stress is relatively small, it is possible to reduce the influence of the residual stress on the sealed portion.

In this embodiment, the example in which the groove 94 is situated substantially at the center of one side that is a short side of the lid 92, as viewed in a plan view, is described. However, this example is not limiting. As long as the groove 94 is provided at least on one side of the outer peripheral surface 92c of the lid 92, a gap that enables gas exhaustion from the internal space 14 of the package 9 as described later can be provided.

Although the width of the groove 94 is not particularly limited, it is preferable that the width of the groove 94 is approximately 1 μm or greater and 200 μm or smaller. It is more preferable that the width of the groove 94 is approximately 70 μm or greater and 200 μm or smaller in order to secure both an ability to exhaust gas (formability of unwelded part) and an ability to seal. Meanwhile, though the depth of the groove 94 is not particularly limited, it is preferable that the depth of the groove 94 is approximately 5 μm or greater and 30 μm or smaller.

In some cases, seam welding may be carried out after a metal layer (not shown) that can be melted by seam welding is formed on each of the base 91 and the lid 92 at the joining part between the base 91 and the lid 92. Also in such cases, the above lid 92 can be applied.

Then, after the recessed portion (internal space 14) is exhausted of gas through the gap between the package 9 and the lid 92, which is an unwelded part that can be formed by the groove 94, the lid 92 situated above the unwelded part (the part where the groove 94 is provided) and/or the seam ring 93 situated below the unwelded part is melted by an energy beam such as a laser beam. With the sealing portion 95 as a melting portion formed by the melted lid 92 and/or seam ring 93, the gap in the unwelded part is filled to seal the internal space 14 airtightly.

Here, the first mark 96 and the second mark 106 as marks will be described in detail, referring to FIGS. 4A and 4B. The first mark 96 and the second mark 106 are provided on the second surface 92a and arranged at positions that do not overlap with the outer peripheral edge of the second surface 92a (ridgeline where the second surface 92a and the outer peripheral surface 92c contact each other) and a welding area, later described, as viewed in a plan view. The first mark 96 and the second mark 106 in this example are provided by digging (forming) circular recesses in the second surface 92a. It should be noted that the first mark 96 and the second mark 106 are not limited to the circular shape and may have any recognizable shape, for example, an ellipse, triangle, quadrilateral, polygon, straight line, curve, or curve or straight line connecting a start point and an end point. Also, the first mark 96 and the second mark 106 are not limited to recesses and can be formed, for example, using a printing method on the surface of the second surface 92a.

The first mark 96 and the second mark 106 are provided near the groove 94, as viewed in a plan view, on the surface on the side opposite to the groove 94, and function as marks for position recognition of the groove 94. Since the first mark 96 and the second mark 106 are present on the surface on the side opposite to the groove 94 in this manner, the position of the groove 94 can be calculated from the side of the second surface 92a, where the groove 94 cannot be visually recognized. Also, since the first mark 96 and the second mark 106 are provided on the second surface 92a and arranged at the positions that do not overlap with the outer peripheral edge of the second surface and the welding area (joining area), later described, as viewed in a plan view, the marks will not be deformed or partly melted even if the vicinity of the outer peripheral surface 92c is deformed or melted as it is joined with the seam ring 93. This enables the posture of the lid 92 to be recognized constantly on the basis of the first mark 96 and the second mark 106.

Also, the first mark 96 and the second mark 106 are arranged in different areas on the second surface divided by a first imaginary straight line C that bisects the lid 92, connecting the center of a width B of the groove 94 in a direction (x-axis direction in the illustration) intersecting with the extending direction of an imaginary line (not shown) connecting the groove 94, the center part of the first surface 92b, and the center G of the first surface 92b. As the plurality of marks (first mark 96 and second mark 106) is provided in this manner, a misalignment in the rotating direction (about the z-axis in the illustration) of the lid 92 can be recognized further and the amount of misalignment can be calculated. Therefore, the sealing accuracy can be enhanced further. Also, since the first mark 96 and the second mark 106 are arranged in the areas on both sides of the groove 94, a large spacing can be provided between the first mark 96 and the second mark 106, thus enabling enhancement of the detection accuracy of the position of the groove 94. Thus, the likelihood of a sealing failure of the groove 94 can be reduced in a sealing process, described later.

The first mark 96 and the second mark 106 are arranged respectively in such a way that these marks are at line-symmetrical positions about the first imaginary straight line C. That is, these marks are arranged in such a way that the spacing (distance) W1 between the center P1 of the first mark 96 and the first imaginary straight line C and the spacing (distance) W2 between the center P2 of the second mark 106 and the first imaginary straight line C are equal. As the first mark 96 and the second mark 106 are thus arranged, the first mark 96 and the second mark 106 are arranged at an equal distance from the position of the groove 94 and therefore position recognition processing can be carried out easily.

With the provision of the groove 94 and the corresponding first mark 96 and second mark 106 as described above, an irradiating position (welding position) of a laser beam 98 as an energy beam in the sealing process, described later, can be designated. That is, the irradiating position of the laser beam 98 can be calculated as a position P3 at a distance D from a second imaginary straight line L connecting the center P1 of the first mark 96 and the center P2 of the second mark 106, on the first imaginary straight line C intersecting with the second imaginary straight line L. Thus, a misalignment at the time of sealing the groove 94 can be prevented and the occurrence of a sealing failure (an air leak failure) can be reduced.

In this embodiment, the example in which the single groove 94 is provided on the lid 92 is described. However, the number and arrangement of the groove is not limited to this example. A plurality of grooves may be provided and the grooves may be provided on both the second surface 92a and the first surface 92b of the lid 92. Also, though the triangular wedge shape having two vertices on the side of the first surface 92b is employed as the lateral cross-sectional shape of the sidewall of the groove 94, any shape that cannot be melted by seam welding can be employed, such as rectangular, curved, or semicircular (arc-shaped).

Method for Manufacturing Oscillator and Package

Next, a method for manufacturing an oscillator as an electronic device using a package according to the invention, and a package, will be described with reference to FIGS. 5A to 5D and FIGS. 6A to 6D. FIGS. 5A to 5D are front cross-sectional views schematically showing a manufacturing process of the oscillator shown in FIG. 1 and FIGS. 2A and 2B. FIGS. 6A to 6D show a sealing process. FIG. 6A is a plan view showing the state before sealing. FIG. 6B is a front cross-sectional view of FIG. 6A. FIG. 6C is a plan view showing the state after sealing. FIG. 6D is a front cross-sectional view of FIG. 6C.

First, a process of housing the gyro element 2 as an electronic component in the internal space 14 of the package 9 as a container of the base 91 will be described. As shown in FIG. 5A, a base 91 which has a plate-like bottom plate 911 and a frame-like sidewall 912 provided on the peripheral edge part on the upper surface of the bottom plate 911, and which has a recessed space surrounded by the bottom plate 911 and the inner wall of the sidewall 912 and opening to the top side, is prepared. A seam ring 93 as a joining area is provided on an upper surface 912a of the frame-like sidewall 912 of the base 91. Also, a lid 92 as a lid body used in a later process is prepared. The above-described gyro element 2 is also prepared. Then, connection pads 10 and the gyro element 2 are electrically connected together and fixed. For this connection, a conductive fixing member 8 such as a solder, metallic bump, or conductive adhesive (adhesive containing a conductive filler such as metal particles (for example, silver particles) dispersed in a resin material) can be used. In this case, a gap is formed between the gyro element 2 and the upper surface of the bottom plate 911, due to the thickness of the conductive fixing member 8. If electrical connection between the gyro element 2 and the connection pads 10 is not necessary, a non-conductive adhesive or the like can be used.

Next, a process of placing the lid 92 as a lid body on the recessed space will be described. As shown in FIG. 5B, in order to airtightly hold the gyro element 2 housed in the internal space 14, the lid 92 as a lid body is placed on the seam ring 93. A groove 94 is provided on a first surface 92b of the lid 92. A first mark 96 and a second mark 106 as marks are provided on a second surface 92a of the lid 92. The configuration of the lid is already described above and therefore will not be described further in detail. As shown in FIGS. 6A to 6D, the lid 92 is placed in such a way that the first surface 92b is laid on the side of the seam ring 93 and that the one end 94a on the outer peripheral side of the groove 94 is situated on the seam ring 93 while the other end 94b on the side of the internal space 14 of the groove 94 is at a position overlapping with the internal space 14, as viewed in a plan view (as viewed from the side of the lid 92).

Next, a joining process in which the lid 92 is joined to the base 91 via the seam ring 93 (first welding process) will be described. As shown in FIG. 5C, the part where the lid 92 and the seam ring 93 face each other on the frame-like sidewall 912 is seam-welded in the form of a rectangular perimeter, using roller electrodes 97 of a seam welder, so that lid 92 and the seam ring 93 are welded together. That is, the lid 92 is joined to the base 91. The roller electrodes 97 pressurize and contact the lid 92 from the side opposite to the base 91, by a pressurizing mechanism, not shown. The roller electrode 97 travels at a predetermined speed along the outer periphery of the lid 92, as viewed in a plan view, while rotating about the axial line thereof. At this point, a current is provided between the roller electrodes 97 via the lid 92 and the seam ring 93, thereby melting the seam ring 93 or the joining metal with Joule heat and joining the lid 92 and the seam ring 93 together. In this way, the lid 92 is welded (joined) to the base 91 via the seam ring 93 provided on the upper surface 912a of the frame-like sidewall 912 forming the base 91. Here, at the site where the groove 94 is provided, since the lid 92 and the seam ring 93 are not in contact with each other, the above welding is not carried out and an unwelded part where the lid 92 and the seam ring 93 are not welded together is formed. A configuration or method in which the lid 92 is directly welded (joined) to the base 91 may also be employed.

Next, a process of exhausting gas from the internal space 14, using the groove 94 (exhaust hole), will be described with reference to FIG. 5D. In this embodiment, the gap formed by the groove 94, which is not welded in the above seam welding, extends as a communicating portion that reaches the internal space 14. Therefore, gas can be exhausted from the internal space 14, using the gap formed by the groove 94 as an exhaust hole. Then, the process shifts to a sealing process in which a laser beam 98 is directed onto the lid 92, thereby melting the lid 92 to close the groove 94 and thus airtightly sealing the internal space 14 where gas exhaustion is finished. The sealing process will be described later. In this embodiment, the example of sealing in the state where gas is exhausted from the internal space 14, that is, so-called under reduced pressures, is described. However, it is also possible to perform sealing not only under reduced pressures but also in an inert gas atmosphere where an inert gas is introduced after gas exhaustion.

Next, the sealing process in which the internal space 14 where gas exhaustion is finished is airtightly sealed will be descried with reference to FIGS. 6A to 6D. In the sealing process, in the state where gas exhaustion from the internal space 14 is finished, the lid 92 at the portion (communicating portion) corresponding to the gap formed by the groove 94 used as an exhaust hole is irradiated with an energy beam (for example, a laser beam or electron beam). In this embodiment, the laser beam 98 is used as an energy beam. As described above in the explanation of the lid, the irradiating position of the laser beam 98 is positioned by a process of determining the position of the groove 94, using the first mark 96 and the second mark 106. To explain in more detail, the position P3 of the distance D from the second imaginary straight line L connecting the center P1 of the first mark 96 and the center P2 of the second mark 106 shown in FIGS. 4A and 4B, on the first imaginary straight line C intersecting with the second imaginary straight line L, is calculated. Then, the laser beam 98 is directed onto the position P3 on the lid 92, thus melting the metal (kovar) of the unwelded part. As described above in the explanation of the lid, the first mark 96 and the second mark 106 shown in FIGS. 4A and 4B are provided on the second surface 92a and arranged at positions that do not overlap with the outer peripheral edge of the second surface 92a and the welding area in the joining process (first welding process), as viewed in a plan view. Thus, in the joining process (first welding process), even if the vicinity of the outer peripheral surface 92c is deformed or melted by joining to the seam ring 93 or the like, the first mark 96 and the second mark 106 will not be deformed or partly melted. Therefore, a package in which the detection accuracy of the position of the groove 94 on the basis of the first mark 96 and the second mark 106 is enhanced and in which sealing failure of the groove 94 is reduced, can be provided. Also, by deciding the irradiating position of the laser beam 98 as described above, it is possible to prevent a misalignment at the time of sealing the groove 94 and reduce the occurrence of a sealing failure (an air leak failure).

In the irradiation with the laser beam 98, the laser beam 98 is directed in such a way that the end on the outer side of the groove 94 (gap), that is, the one end of the groove 94 (gap) including the outer peripheral surface 92c of the lid 92, is arranged to be included in the spot of the laser beam 98. Then, with thermal energy generated by the irradiation with the laser beam 98, an upper part 92d above the groove 94 (gap) of the lid 92 at the part where the groove 94 is provided is melted and the molten metal flows onto the seam ring 93 while filling the gap formed by the groove 94. As the irradiation with the laser beam 98 is stopped when the molten metal has flowed sufficiently, the molten metal becomes solidified and this solidified molten metal forms a sealing portion (melted portion) 95 and closes the gap of the groove 94. Thus, the internal space 14 is sealed airtightly. As described above, since the laser beam 98 is directed in such a way as to include the end on the outer side of the groove 94 (gap), that is, the end part of the groove 94 (gap) including outer peripheral surface 92c of the lid 92, in the spot of the laser beam 98, and the upper part 92d of the lid including the end of the groove (gap) is thus melted, the fluidity of the molten metal becomes better. As the fluidity of the molten metal is thus improved, the sealing of the gap formed by the groove 94 can be carried out securely.

In the oscillator 1 as an electronic device using the package 9 formed by these processes, since the groove 94 serves as an exhaust hole, the dimensional control or the like of the unwelded part (exhaust hole) used for gas exhaustion as in the related-art technique is not necessary and gas exhaustion and joining (sealing) are carried out stably. Even if the oscillator 1 is heated to high temperatures after joining (sealing), the influence of the resulting gas can be restrained. Also, in the sealing process, the irradiating position of the laser beam 98 is calculated on the basis of the first mark 96 and the second mark 106, and the laser beam 98 is directed there. Thus, a misalignment at the time of seating the groove 94 can be prevented and the occurrence of a sealing failure (an air leak failure) can be reduced. Moreover, the stable gas exhaustion and joining (sealing) enable prevention of deterioration of characteristics of the gyro element 2 as an electronic component housed in the package 9 due to the influence of residual gas or the like. The oscillator 1 as an electronic device with stable characteristics can be provided.

In the above description, the example using the single exhaust hole (groove 94) is described. However, a plurality of exhaust holes may be provided. That is, the groove 94 may be provided in a plural number. In the case where a plurality of exhaust holes is used in this manner, the exhaust speed rises but a plurality of sealing sites is needed.

Modifications of Marks

Figure 7A:
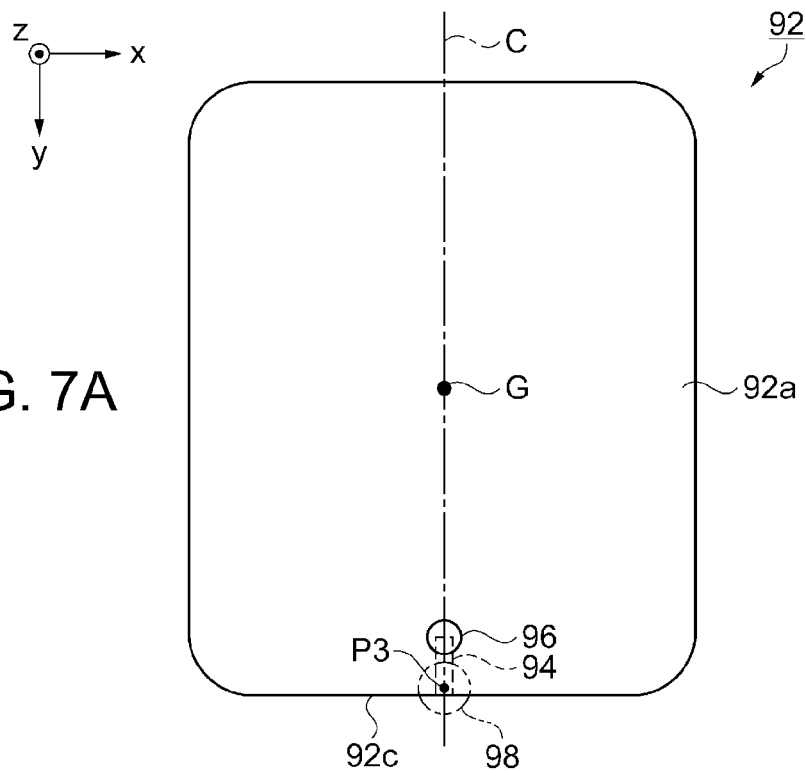
FIGS. 7A and 7B are plan views showing examples of arrangement of marks.
Figure 7B:
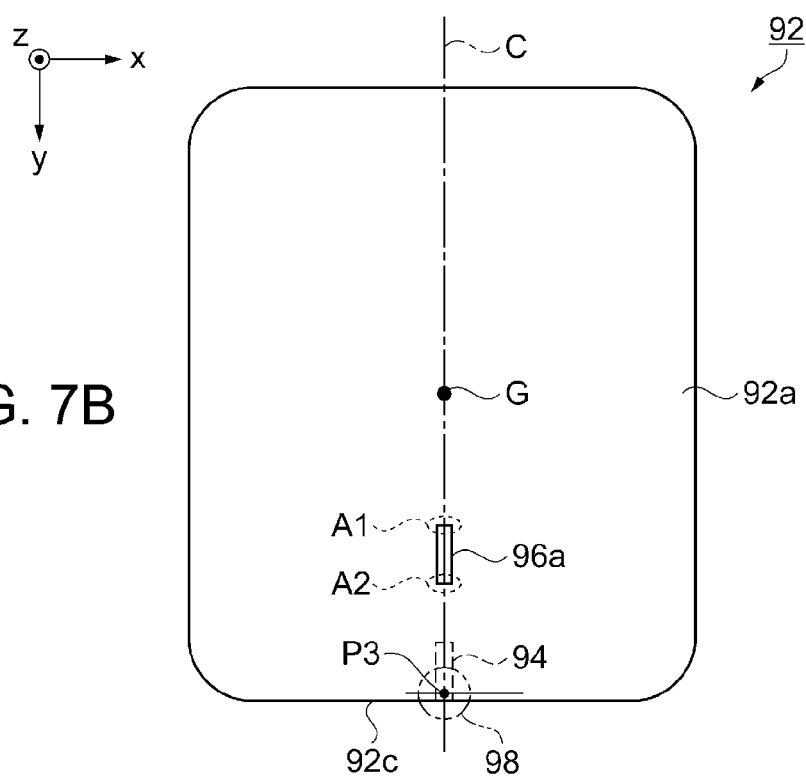
Figure 8A:
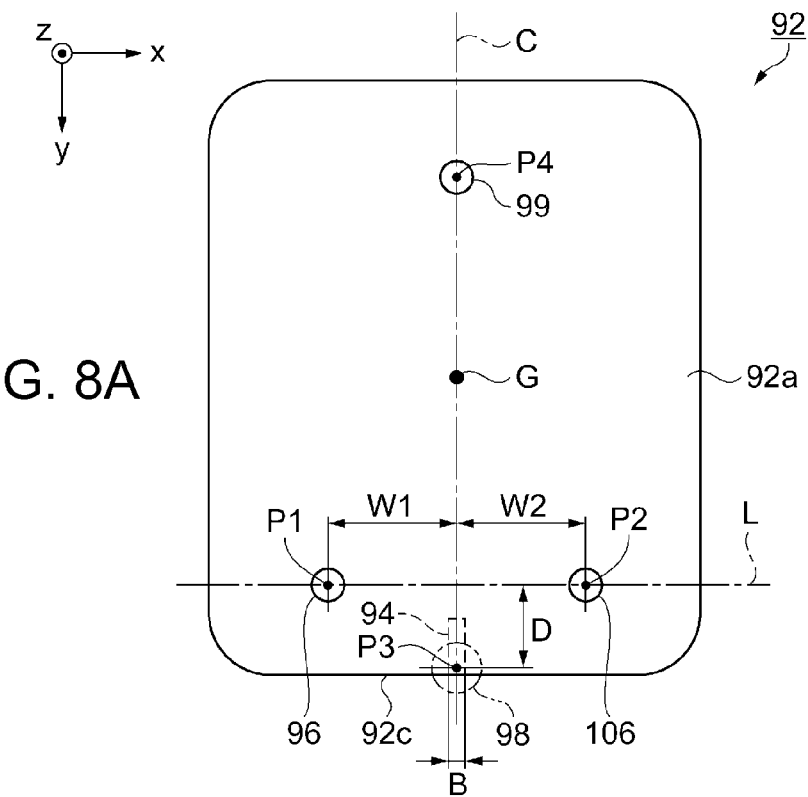
FIGS. 8A and 8B are plan views showing examples of arrangement of marks.
Figure 8B:
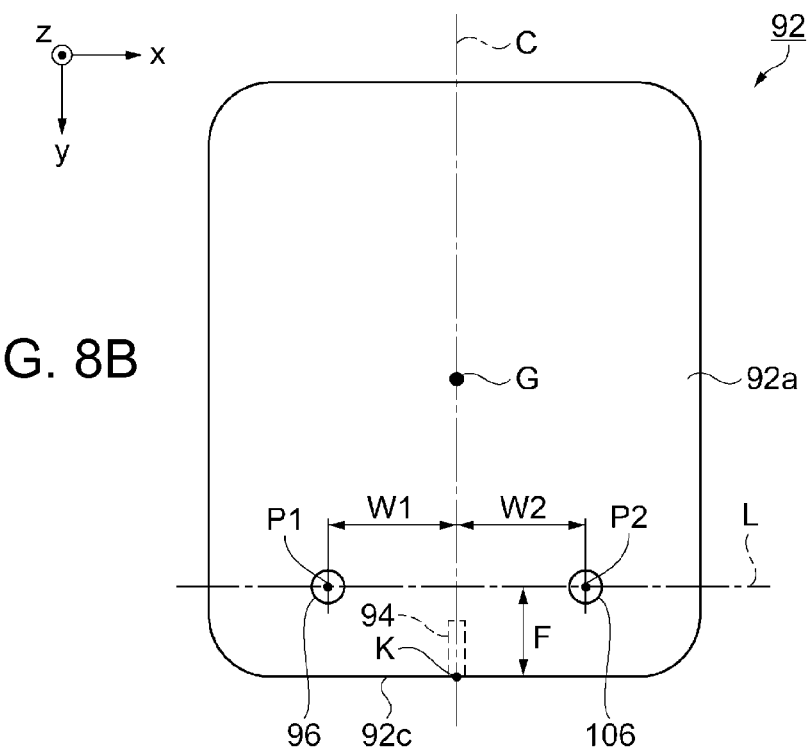

Now, modifications of the mark will be described with reference to FIGS. 7A and 7B and FIGS. 8A and 8B. FIGS. 7A and 7B are plan views showing modifications of the mark and showing examples of the arrangement of a mark. FIGS. 8A and 8B are plan views showing other modifications of the mark and showing examples of the arrangement of marks. The same configurations as in the first embodiment may be denoted by the same reference numerals without further description.

Modification 1

Referring to FIG. 7A, a modification 1 of the mark will be described. As the mark in the modification 1, a single first mark 96 is provided. The groove 94 is provided on the first surface (not shown) of the lid 92, and the first mark 96 is provided on the second surface 92*a* having a top-bottom relation with the first surface. The first mark 96 is provided on the second surface 92*a* of the lid 92 and at a position that does not overlap with the outer peripheral surface of the second surface 92*a*, that is, a position that overlaps with the groove 94, as viewed in a plan view.

As the first mark 96 is provided in this manner, the position of an end of the groove 94 can be directly recognized with the first mark 96. Therefore, the detection accuracy of the groove position is enhanced and the position accuracy of the position P3 where the laser beam 98 is directed can be improved. Thus, sealing failure of the groove 94 can be reduced.

Modification 2

Referring to FIG. 7B, a modification 2 of the mark will be described. As the mark in the modification 2, a single mark 96*a* is provided. The groove 94 is provided on the first surface (not shown) of the lid 92, and the mark 96*a* is provided on the second surface 92*a* having a top-bottom relation with the first surface. The mark 96*a* is provided on the first imaginary straight line C which bisects the lid 92, connecting the center of the width of the groove 94 in the direction (x-axis direction in the illustration) intersecting with the extending direction (y-axis direction in the illustration) of the imaginary line (not shown) connecting the groove 94 and the center part of the second surface 92*a*, and the center G of the second surface 92*a*, as viewed in a plan view. The mark 96*a* is substantially rectangular (in this example, a rectangle) and extends on the first imaginary straight line C as the longitudinal direction thereof. The mark 96*a* has a first recognition area A1 and a second recognition area A2 as a plurality of recognition areas. At least two recognition areas may be provided. The first recognition area A1 and the second recognition area A2 are provided at both ends of the mark 96*a* and formed by a side in the y-axis direction and a side in the x-axis direction in the illustration.

Since the first recognition area A1 and the second recognition area A2 thus have two sides, the position of each of the first recognition area A1 and the second recognition area A2 can be detected. On the basis of the detected positions of the first recognition area A1 and the second recognition area A2, the position P3 where the laser beam 98 is directed is decided. Since the position P3 where the laser beam 98 is directed is decided on the basis of the plurality of recognition areas (in this example, the two recognition areas) in this manner, a rotational misalignment (rotation about the z-axis) or the like of the lid can be determined further and the detection accuracy of the position of the groove 94 can be enhanced further. This enables reduction in the likelihood of a sealing failure of the groove 94.

Modification 3

Referring to FIG. 8A, a modification 3 of the mark will be described. As the mark in the modification 3, three marks are provided. The groove 94 is provided on the first surface (not shown) of the lid 92, and a first mark 96, a second mark 106 and a third mark 99 are provided on the second surface 92*a* having a top-bottom relation with the first surface. The first mark 96, the second mark 106 and the third mark 99 are arranged at positions that do not overlap with at least the outer peripheral surface 92*c* and the welding area of the lid 92, as viewed in a plan view. The first mark 96 and the second mark 106 are arranged in different areas on the second surface 92*a* divided by the first imaginary straight line C which bisects the lid 92, connecting the center of the width B of the groove 94 in the direction (x-axis direction in the illustration) intersecting with the extending direction (y-axis direction in the illustration) of the imaginary line (not shown) connecting the groove 94 and the center part of the first surface, and the center G of the second surface 92*a*, as in the first embodiment. The first mark 96 and the second mark 106 are arranged in such a way that the spacing (distance) W1 between the center P1 of the first mark 96 and the first imaginary straight line C and the spacing (distance) W2 between the center P2 of the second mark 106 and the first imaginary straight line C are equal. The third mark 99 has the center P4 thereof arranged on the first imaginary straight line C in such away that the center P4, and the point at which the second imaginary straight line L connecting the center P1 of the first mark 96 and the center P2 of the second mark 106 intersects with the first imaginary straight line C, become point-symmetrical about the center G. The irradiating position of the laser beam 98 is calculated as the position P3 at the distance D from the second imaginary straight line L connecting the center P1 of the first mark 96 and the center P2 of the second mark 106, on the first imaginary straight line C intersecting with the second imaginary straight line L, after a misalignment in the rotating direction of the lid 92 is calculated and corrected using the first mark 96, the second mark 106 and the third mark 99.

Since the first mark 96, the second mark 106 and the third mark 99 are thus arranged at least in three areas, a misalignment in the rotating direction of the lid can be recognized with higher accuracy and the detection accuracy of the position of the groove 94 is enhanced. Thus, sealing failure (air leak failure) of the groove 94 can be reduced further.

In the modification 3, the example using the first mark 96, the second mark 106, and the third mark 99 arranged on the first imaginary straight line C is described. However, the number of marks arranged is not limited to this. For example, a configuration in which two marks are provided at positions that are point-symmetrical with the first mark 96 and the second mark 106 about the center G, that is, a configuration in which four marks are provided, may also be employed.

Modification 4

Referring to FIG. 8B, a modification 4 of the mark will be described. As the mark in the modification 4, two marks are provided. The groove 94 is provided on the first surface (not shown) of the lid 92, and a first mark 96 and a second mark 106 are provided as the marks on the second surface 92a having the top-bottom relation with the first surface. In this case, the first mark 96 and the second mark 106 are arranged in such a way that the distance F between the second imaginary straight line L passing through the center P1 of the first mark and the center P2 of the second mark 106, which are line-symmetrical about the first imaginary straight line C, and the point of intersection K with the shorter distance from the second imaginary straight line L, of the points of intersection between the first imaginary straight line C and the outer peripheral surface 92c, is shorter than the spacing (distance) W1 between the center P1 of the first mark 96 and the first imaginary straight line C and the spacing (distance) W2 between the center P2 of the second mark 106 and the first imaginary straight line C.

As the first mark 96 and the second mark 106 are arranged in this positional relation, the spacings W1 and W2 with which to determine a misalignment in the rotating direction (about the z-axis) become greater.

Thus, even if some recognition errors of the first mark 96 and the second mark 106 occur, the detection accuracy in the rotating direction can be maintained and the detection accuracy of the position of the groove 94 is enhanced. Therefore, sealing failure (air leak failure) of the groove 94 can be reduced.

Second Embodiment of Electronic Device

Figure 9:
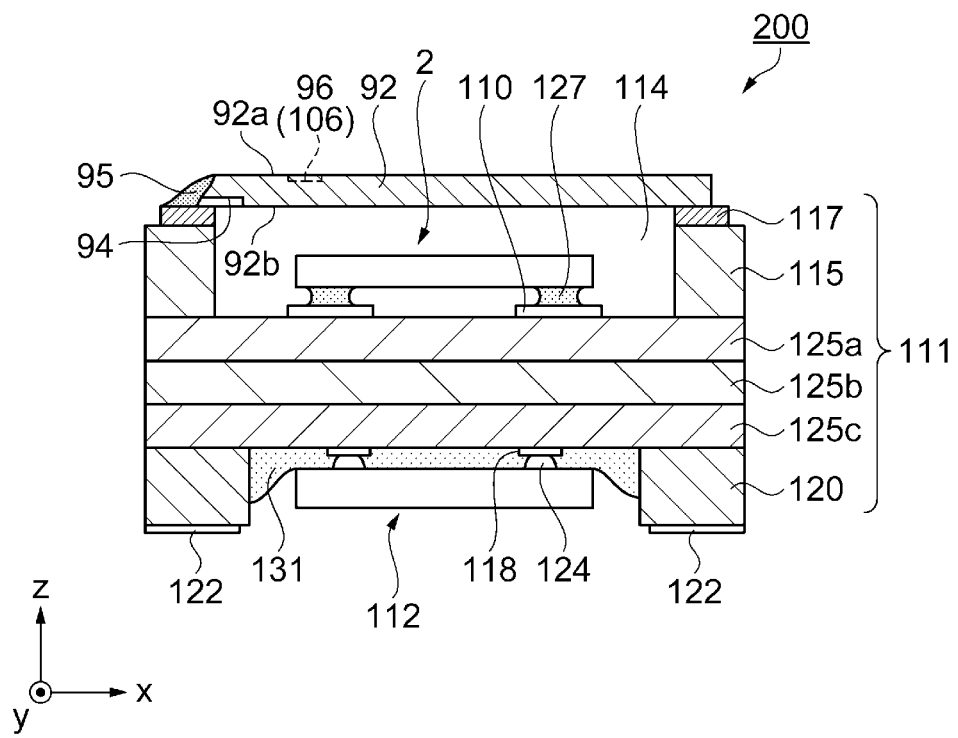
FIG. 9 is a front cross-sectional view schematically showing a gyro sensor according to a second embodiment.

Next, as a second embodiment of an electronic device, an embodiment of a gyro sensor will be described with reference to FIG. 9. FIG. 9 is a front cross-sectional view schematically showing the gyro sensor. In this embodiment, similar configurations to the first embodiment may be denoted by the same reference numerals without further description.

A gyro sensor 200 has a gyro element 2 as an electronic component, an IC 112 as a circuit element, a package (base) 111 as a housing container, and a lid 92 as a lid body. The package 111, made of a ceramic or the like, has a third substrate 125c, a second substrate 125b and a first substrate 125a that are stacked together, a frame-like sidewall 115 provided on a surface peripheral edge part of the first substrate 125a, and a frame-like sidewall 120 provided on a surface peripheral edge part of the third substrate 125c.

On the upper surface of the frame-like sidewall 115, a seam ring 117 as a joining member made of an alloy, for example, kovar or the like, is formed. The seam ring 117 has the function of a joining member to the lid 92 and is provided in the shape of a frame (perimeter) along the upper surface of the sidewall 115. The lid 92 has a groove 94 provided at an end part of a first surface 92b that is a surface facing the seam ring 117. The lid 92 also has a first mark 96 and a second mark 106 provided as marks. The configuration of the lid 92 including these parts is similar to the first embodiment and therefore will not be described further in detail. The groove 94 is formed in such way as to reach an internal space 114 when the lid 92 is placed on the seam ring 117. Here, the space surrounded by a surface (upper surface in the illustration) of the first substrate 125a and the inner wall of the frame-like sidewall 115 is the internal space 114 for housing the gyro element 2, and the space surrounded by the third substrate 125c and the inner wall of the frame-like sidewall 120 is a housing section for the IC 112. The internal space 114, where the gyro element 2 is housed, is exhausted of gas (degassed) through the groove 94 and subsequently sealed with a sealing portion 95 that is formed as the lid 92 in the unwelded part where the groove 94 is formed is melted and then solidified. A plurality of external terminals 122 is provided on a surface (lower surface in the illustration) of the frame-like sidewall 120.

A plurality of connection pads 110 is formed on the surface of the first substrate 125a situated in the internal space 114 for the gyro element 2. The gyro element 2 is electrically connected and fixed to the connection pads 110. For this connection, a conductive fixing member 127 such as a solder, silver paste or conductive adhesive (adhesive containing a conductive filler such as metal particles dispersed in a resin material) can be used. In this case, the gyro element 2 has a gap from the surface of the first substrate 125a, due to the thickness of the conductive fixing member 127. If electrical connection between the gyro element 2 and the connection pads 110 is not necessary, a non-conductive adhesive or the like can be used.

The internal space 114, where the gyro element 2 is housed, has the opening thereof closed by the lid 92 as a lid body and sealed airtightly. The lid 92 has a similar configuration to the lid 92 described in the first embodiment and therefore the outline thereof will be described without detailed description. The lid 92 closes the opening of the internal space 114 opening to the top side of the package 111 and the perimeter of the opening is joined, for example, using a seam welding method or the like. A kovar plate member is used as the lid 92. The lid 92 has a second surface 92a and a first surface 92b that are in a top-bottom relation. As in the first embodiment, the closed-bottom groove 94 provided from the outer peripheral surface of the lid 92 toward the internal space 114 (center part) is provided on the side of the first surface 92b of the lid 92. After the internal space 114 is exhausted of gas through the groove 94 as the gap between the seam ring 117 and the lid 92, the portion positioned by the first mark 96 and the second mark 106 including the end part of the groove 94 is melted by a laser beam or the like and then solidified, thus sealing the internal space 114 airtightly.

Meanwhile, connection electrodes 118 are formed on the surface of the third substrate 125c situated in the housing section for the IC 112. The connection electrodes 118 and the IC 112 are electrically connected and fixed together via a conductive adhesive, solder or gold (Au) bump 124 or the like. The space between the IC 112 and the surface of the third substrate 125c is filled with an underfill 131 such as a resin. The resin may be provided in such a way as to cover the IC 112. The connection pads 110, the connection electrodes 118, the external terminals 122 and the like are each connected via an internal wire or the like, though not described or illustrated in this embodiment.

Method for Manufacturing Gyro Sensor

Next, a method for manufacturing the gyro sensor 200 will be described. Similar processes to the processes in the above method for manufacturing the oscillator 1 will not be described further. A process of housing the gyro element 2 in the internal space 114 of the package 111 as the base, a process of placing the lid 92 on the internal space 114, a joining process in which the lid 92 is joined to the package 111, and a sealing process in which the internal space 114 where gas exhaustion is finished is sealed airtightly, will be described in detail.

In addition to the above processes, in the manufacturing of the gyro sensor 200, the IC 112 is housed in the housing section for the IC 112 surrounded by the frame-like sidewall 120 provided on the surface peripheral edge part of the third substrate 125*c*. The IC 112 is electrically connected and fixed to the connection electrodes 118 provided on the surface of the third substrate 125*c*, using the gold (Au) bump 124. The underfill 131 such as a resin is injected into the space between the IC 112 and the surface of the third substrate 125*c*, thus filling the space (gap). Through these processes, the gyro sensor 200 is completed.

According to the second embodiment, as in the first embodiment, good fluidity of the molten metal (lid 92) due to the laser beam is achieved and the formation of the sealing portion 95 can be carried out securely. Also, the sealing portion 95 can be formed at the position decided on the basis of the first mark 96 and the second mark 106 provided on the lid 92. Therefore, the sealing of the groove 94 can be carried out securely and the gyro sensor 200 as an electronic device with improved reliability of airtightness can be manufactured. Moreover, since the groove 94 serves as an exhaust hole, dimensional control or the like of the unjoined part (exhaust hole) used for gas exhaustion as in the related-art technique is no longer necessary, and gas exhaustion and joining (sealing) are carried out stably. Therefore, even if the gyro sensor 200 is heated to high temperatures after the joining (sealing), the influence of generation of gas can be restrained. Also, the stable gas exhaustion and joining (sealing) enable prevention of deterioration of the characteristics of the gyro element 2 as an electronic component housed in the package 111 due to the influence of residual gas or the like. Thus, the gyro sensor 200 as an electronic device with stable characteristics can be provided.

In the above description of the electronic device, the oscillator 1 and the gyro sensor 200 that use the so-called double-T-type gyro element 2 as an electronic component are described as examples. However, these examples are not limiting and the technique can also be applied to other electronic devices in which an element is housed airtightly in a package. Such other electronic devices may be, for example, a gyro sensor using an H-type or tuning fork-type gyro element as an electronic component, a timing device (oscillator, oscillating unit or the like) using an oscillation element, a pressure sensor using a pressure-sensitive element, a semiconductor device using a semiconductor element, or the like.

The oscillation element may be a crystal oscillation element using quartz crystal as a substrate material, for example, an AT-cut or SC-cut crystal oscillation element or a tuning fork-type crystal oscillator element, a SAW (surface acoustic wave) resonance element which excites elastic surface waves, or a MEMS (micro electro-mechanical systems) oscillation element. As the substrate material of the oscillation element, other than quartz crystal, piezoelectric single crystals such as lithium tantalate and lithium niobate, piezoelectric materials such as piezoelectric ceramics like lead zirconate titanate, or silicon semiconductor materials or the like can be used. As the exciting measure for the oscillation element, a measure based on a piezoelectric effect may be used, or electrostatic drive based on a Coulomb force may be used.

Electronic Apparatus

Next, an electronic apparatus the oscillator 1 as an electronic device or the gyro sensor 200 as an electronic device according an embodiment of the invention is applied will be described in detail with reference to FIGS. 10 to 12. In the description, an example in which the oscillator 1 using the gyro element 2 is applied is described.

Figure 10:
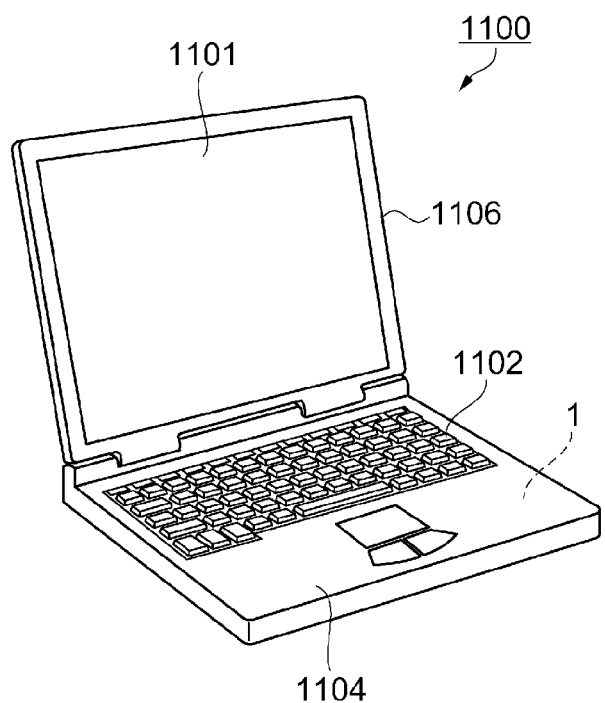
FIG. 10 is a perspective view showing the configuration of a mobile personal computer as an example of an electronic apparatus.

FIG. 10 is a perspective view schematically showing the configuration of a mobile (or notebook) personal computer as an electronic apparatus having the oscillator 1 as an electronic device according to an embodiment of the invention. In FIG. 10, a personal computer 1100 includes a main body section 1104 having a keyboard 1102, and a display unit 1106 having a display section 1101. The display unit 1106 is supported rotatably about the main body section 1104 via a hinge structure. In this personal computer 1100, the oscillator 1 using the gyro element 2 having the function of detecting angular velocity is installed.

Figure 11:
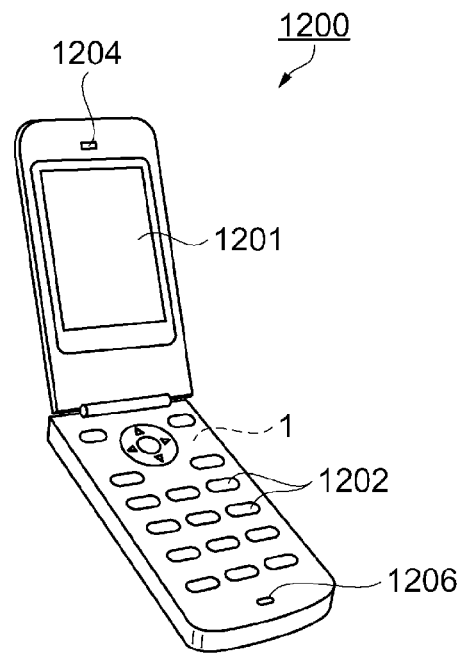
FIG. 11 is a perspective view showing the configuration of a mobile phone as an example of an electronic apparatus.

FIG. 11 is a perspective view schematically showing the configuration of a mobile phone (including PHS) as an electronic apparatus having the oscillator 1 as an electronic device according an embodiment of the invention. In FIG. 11, a mobile phone 1200 has a plurality of operation buttons 1202, an earpiece 1204, and a mouthpiece 1206. A display section 1201 is arranged between the operation buttons 1202 and the earpiece 1204. In this mobile phone 1200, the oscillator 1 using the gyro element 2 functioning as an angular velocity sensor or the like is installed.

Figure 12:
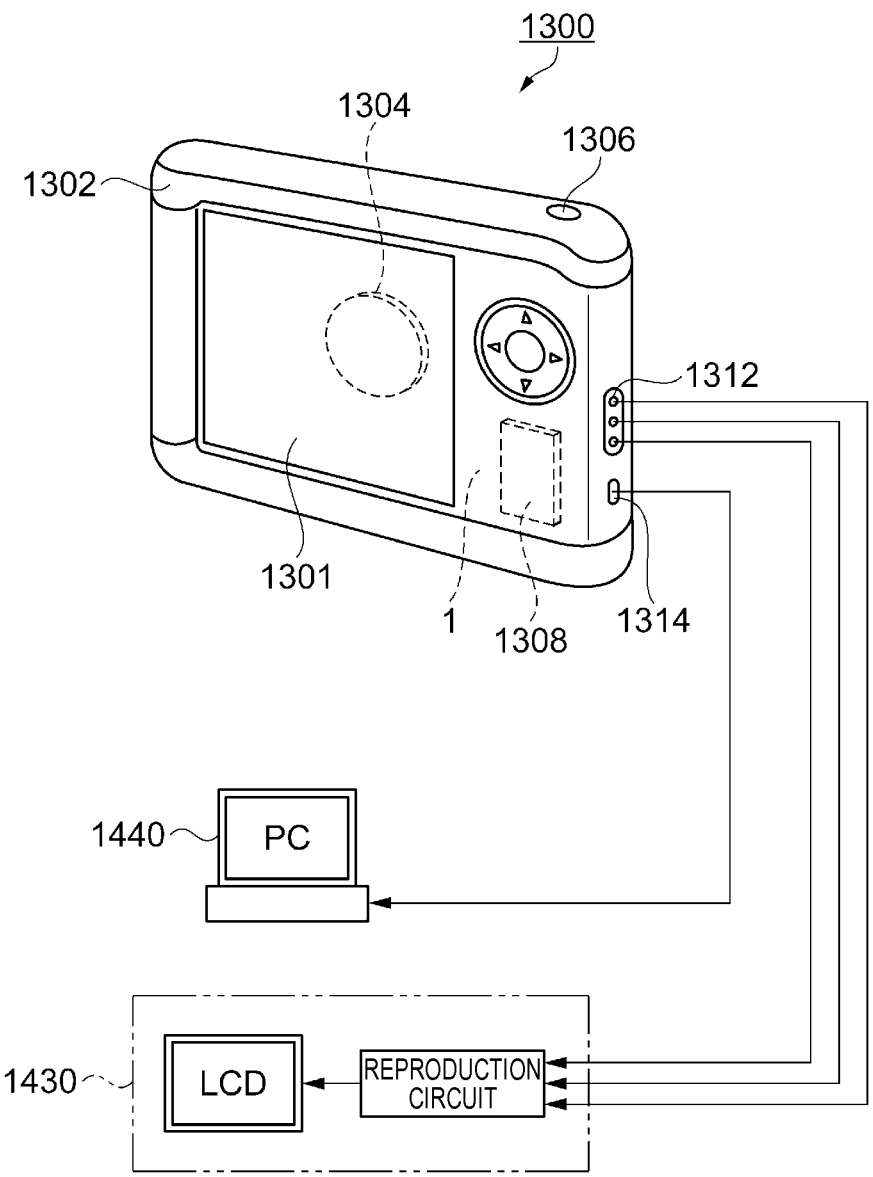
FIG. 12 is a perspective view showing the configuration of a digital still camera as an example of an electronic apparatus.

FIG. 12 is a perspective view schematically showing the configuration of a digital still camera as an electronic apparatus having the oscillator 1 as an electronic device according an embodiment of the invention. FIG. 12 also shows the connection with an external device schematically. Here, while an ordinary camera exposes a silver halide film to light with an optical image of a subject, the digital still camera 1300 photoelectrically converts an optical image of a subject by an image pickup element such as CCD (charge coupled device) and thus generates a pickup image signal (image signal).

A display section 1301 is provided on the back side of a case (body) 1302 of the digital still camera 1300, and configured to perform a display based on the pickup image signal from the CCD. The display section 1301 functions as a viewfinder for displaying an electronic image of a subject. Also, a light receiving unit 1304 including an optical lens (image pickup system), a CCD and the like is provided on the front side of the case 1302 (on the back side in the illustration).

As the photographer confirms the subject image displayed in the display section 1301 and presses a shutter button 1306, the pickup image signal of the CCD at the time is transferred to and stored in a memory 1308. In this digital still camera 1300, a video signal output terminal 1312 and a data communication input/output terminal 1314 are provided on a lateral side of the case 1302. As illustrated, a television monitor 1430 is connected to the video signal output terminal 1312 and a personal computer 1440 is connected to the data communication input/output terminal 1314, as desired. Moreover, the digital still camera is configured in such away that the pickup image signal stored in the memory 1308 is outputted to the television monitor 1430 and the personal computer 1440 in response to a predetermined operation. In this digital still camera 1300, the oscillator 1 using the gyro element 2 functioning as an angular velocity sensor or the like is installed.

The oscillator 1 according to an embodiment of the invention can also be applied to other electronic apparatuses than the personal computer (mobile personal computer) of FIG. 10, the mobile phone of FIG. 11, and the digital still camera of FIG. 12, for example, an ink jet ejection devices (for example, an ink jet printer), laptop personal computers, televisions, video cameras, video recorders, car navigation systems, pagers, electronic organizers (including those with communication functions), electronic dictionaries, electronic calculators, electronic game machines, word processors, workstations, videophones, surveillance monitors, electronic binoculars, POS terminals, medical apparatuses (for example, digital thermometers, blood pressure gauges, blood glucose meters, electrocardiogram measurement devices, ultrasonic diagnosis devices, and electronic endoscopes), fishfinders, various measurement apparatuses, instruments (for example, instruments on vehicles, aircraft or shipping craft), and flight simulators.

Moving Object

Figure 13:
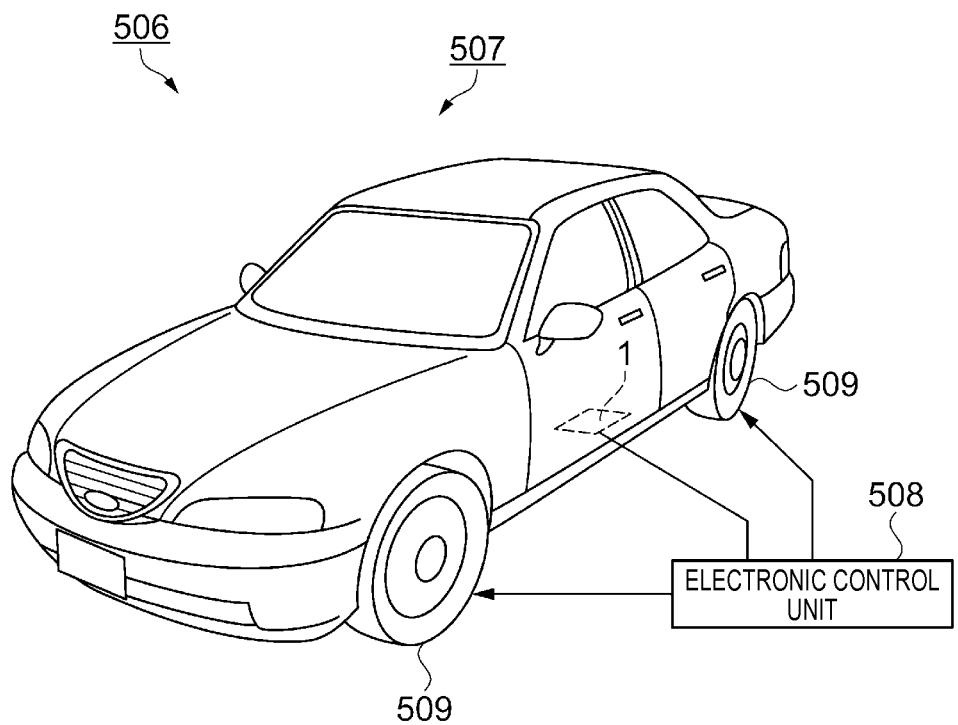
FIG. 13 is a perspective view showing the configuration of an automobile as an example of a moving object.

FIG. 13 is a perspective view schematically showing an automobile as an example of a moving object. An automobile 506 is equipped with the oscillator 1 as an electronic device according to the invention. For example, in the automobile 506 as a moving object, an electronic control unit 508 which includes the oscillator 1 using the gyro element 2 and controls tires 509 or the like is installed in a vehicle body 507, as shown in FIG. 13. The oscillator 1 can also be broadly applied to the electronic control unit (ECU) of keyless entry systems, immobilizers, car navigation systems, car air-conditioning systems, anti-lock braking systems (ABS), air bag systems, tire pressure monitoring systems (TPMS), engine controls, battery monitors of hybrid cars or electric vehicles, and vehicle body posture control systems.

The entire disclosure of Japanese Patent Application No. 2013-232791 filed Nov. 11, 2013 is expressly incorporated by reference herein.

What is claimed is:

1. A lid body sealed to a container, the lid body comprising:
   a first surface;
   a second surface opposite the first surface;
   an outer peripheral surface connecting the first surface and the second surface;
   a groove provided in the first surface and extending partially into the lid body towards the second surface without extending completely to the second surface, the groove extending inwardly from the outer peripheral surface; and
   a mark provided at the second surface, the mark being located at a position that does not overlap with an outer peripheral edge of the second surface in a plan view,
   wherein a portion of the lid where the groove is provided is melted to form an airtight seal between the lid body and the container.

2. The lid body according to claim 1, wherein the mark overlaps with the groove portion.

3. The lid body according to claim 1, wherein the mark has a plurality of recognition areas.

4. The lid body according to claim 1, wherein the mark further comprises a plurality of marks.

5. The lid body according to claim 4, wherein the second surface is bisected into different areas by a first imaginary straight line, and the marks are arranged in the different areas.

6. The lid body according to claim 5, wherein the marks are arranged at line-symmetrical positions relative to the first imaginary straight line.

7. The lid body according to claim 6, wherein a second imaginary straight line passes through a center of each of the marks, and
   a distance between the second imaginary straight line and a point of intersection between the first imaginary straight line and the outer peripheral surface including the groove, is shorter than a distance between the center of each of the marks and the first imaginary straight line.

8. The lid body according to claim 6, wherein another one of the plurality of marks is provided on the first imaginary straight line.

9. The lid body according to claim 1, wherein a joining area securable to the container is provided on the first surface, and
   the mark does not overlap with the joining area in a plan view.

10. The lid body according to claim 5, wherein a joining area securable to the container is provided on the first surface, and
    the mark does not overlap with the joining area in a plan view.

11. The lid body according to claim 6, wherein a joining area securable to the container is provided on the first surface, and
    the mark does not overlap with the joining area in a plan view.

12. A package comprising:
    the lid body according to claim 1; and
    the container having a joining area secured to the lid body,
    wherein the joining area of the container and the first surface of the lid body are joined together.

13. A package comprising:
    the lid body according to claim 5; and
    the container having a joining area secured to the lid body,
    wherein the joining area of the container and the first surface of the lid body are joined together.

14. The packages according to claim 12, wherein the joining area is welded to the lid body, and
    the mark does not overlap with the joining area.

15. The packages according to claim 13, wherein the joining area is welded to the lid body, and
    the mark does not overlap with the joining area.

16. An electronic apparatus comprising the package according to claim 12.

17. An electronic apparatus comprising the package according to claim 13.

18. A moving object comprising the package according to claim 12.

19. A method for manufacturing a package, comprising:
    preparing a lid body and a container having a joining area,
    the lid body including:
      a first surface,
      a second surface opposite the first surface,
      an outer peripheral surface connecting the first surface and the second surface,
      a groove provided in the first surface and extending partially into the lid body towards the second surface without extending completely to the second surface, the groove extending inwardly from the outer peripheral surface, and
      a mark provided at the second surface, the mark being located at a position that does not overlap with an outer peripheral edge of the second surface in a plan view;

arranging the lid body and the container so that the first surface of the lid body and the joining area of the container face each other;

joining the first surface of the lid body and the joining area of the container together in all areas excluding the groove;

determining a position of the groove using the mark;

closing an area between the groove and the joining area based on the determination; and melting a portion of the first surface where the groove is provided to form an airtight seal around an internal space defined by the lid body and the container.

20. A lid body joined to a container to define an internal space, the lid body comprising:

a first surface;

a second surface opposite the first surface;

an outer peripheral surface connecting the first surface and the second surface;

a groove in the first surface and extending partially into the lid body towards the second surface without extending completely to the second surface, the groove extending inwardly from the outer peripheral surface; and first and second marks in the second surface, the first and second marks being spaced apart from the outer peripheral surface in a plan view, wherein a bisector bisects the second surface into first and second areas, the first and second marks are respectively arranged in the first and second areas, and the first and second marks are line-symmetric relative to the bisector, wherein a portion of the lid body where the groove is provided is melted to form an airtight seal around the internal space defined by the lid body and the container.

* * * * *